(12) United States Patent
Schwarz et al.

(10) Patent No.: US 12,169,370 B2
(45) Date of Patent: Dec. 17, 2024

(54) EXPOSURE CONTROL IN PHOTOLITHOGRAPHIC DIRECT EXPOSURE METHODS FOR MANUFACTURING CIRCUIT BOARDS OR CIRCUITS

(71) Applicant: Laser Imaging Systems GmbH, Jena (DE)

(72) Inventors: Christian Schwarz, Jena (DE); Jonas Burghoff, Apolda (DE); Stefan Heinemann, Jena (DE); Holger Wagner, Jena (DE); Steffen Rücker, Großlöbichau (DE); Frank Jugel, Erfurt (DE)

(73) Assignee: Laser Imaging Systems GmbH, Jena (DE)

( * ) Notice: Subject to any disclaimer, the term of this patent is extended or adjusted under 35 U.S.C. 154(b) by 0 days.

(21) Appl. No.: 18/026,585

(22) PCT Filed: Sep. 15, 2021

(86) PCT No.: PCT/DE2021/100762
§ 371 (c)(1),
(2) Date: Mar. 15, 2023

(87) PCT Pub. No.: WO2022/057981
PCT Pub. Date: Mar. 24, 2022

(65) Prior Publication Data
US 2023/0333492 A1    Oct. 19, 2023

(30) Foreign Application Priority Data

Sep. 15, 2020 (DE) ..................... 10 2020 124 006.6

(51) Int. Cl.
*G03F 7/20* (2006.01)
*G03F 7/00* (2006.01)
*G03F 9/00* (2006.01)

(52) U.S. Cl.
CPC ........ *G03F 9/7088* (2013.01); *G03F 7/70383* (2013.01); *G03F 9/7026* (2013.01)

(58) Field of Classification Search
CPC .. G03F 9/7088; G03F 7/70383; G03F 9/7026; G03F 7/70791
See application file for complete search history.

(56) References Cited

U.S. PATENT DOCUMENTS

| 6,245,585 B1 | 6/2001 | Fujimoto |
| 6,449,029 B1 | 9/2002 | Fujimoto |

(Continued)

FOREIGN PATENT DOCUMENTS

| DE | 102017102320 A1 | 8/2018 |
| DE | 102018132001 A1 | 6/2020 |

(Continued)

OTHER PUBLICATIONS

WIPO, International Search Report for PCT/DE2021/100762, Dec. 22, 2021.

*Primary Examiner* — Mesfin T Asfaw
(74) *Attorney, Agent, or Firm* — Hodgson Russ LLP

(57) ABSTRACT

The invention is directed to a device for exposure control in photolithographic direct exposure processes for two-dimensional structures in photosensitive coatings and to a method for converting registration data into direct exposure data. The object of the invention, to find an improved exposure control in direct exposure methods for two-dimensional structures in photosensitive layers which permits a registration of target marks independent from defined locations of the target marks, is met according to the invention in that a plurality of entocentric cameras are arranged in a registration unit (1) in linear alignment transverse to the one-dimensional movement of the substrate (2) to form a gapless linear scanning area (23) over a predetermined width of the substrate (2). The angles of view of adjacent entocentric (Continued)

Figure 1:
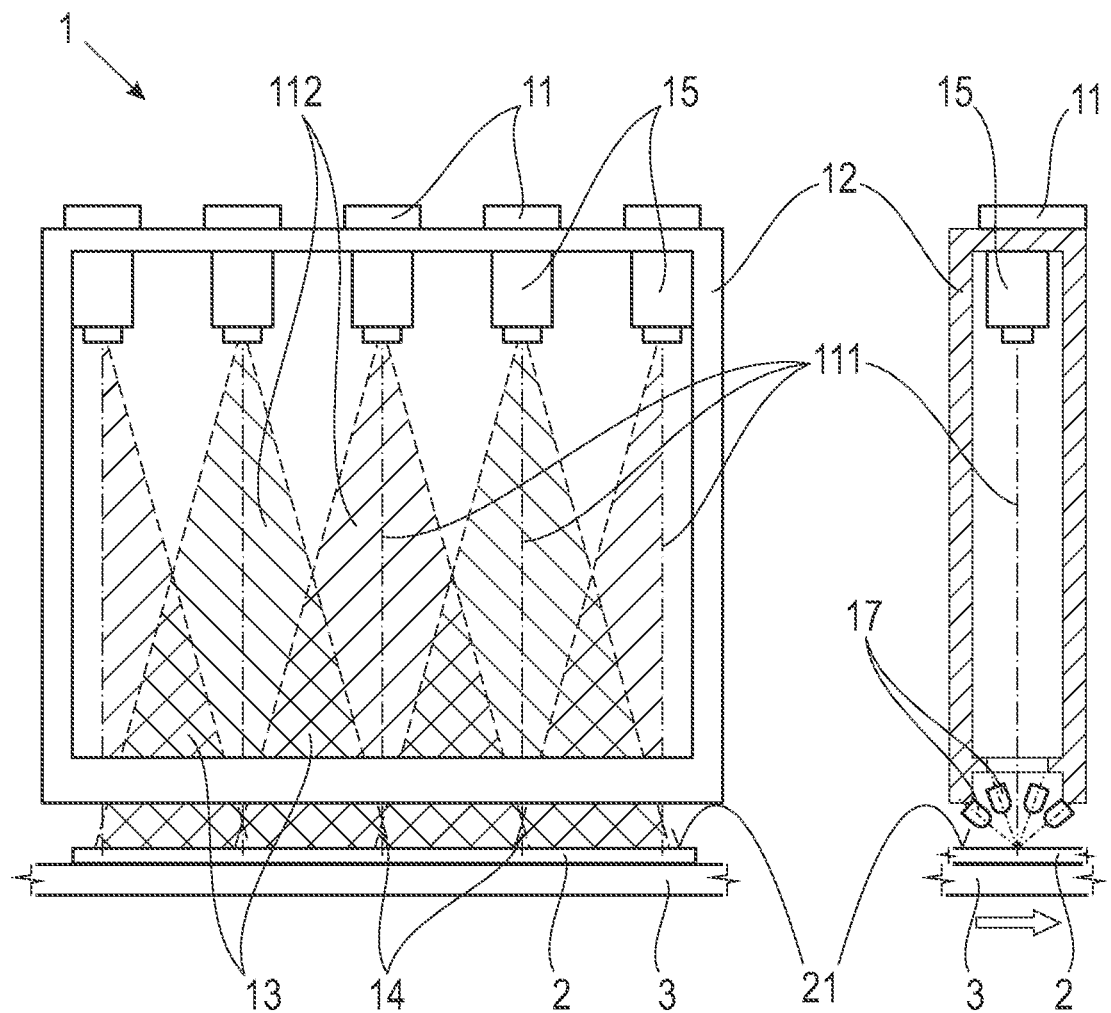

cameras have an overlapping region along the linear scanning area (23) in which redundant image captures of the substrate (2) of the adjacent cameras (11) are detectable, and the computing unit (5) has means for calculating the position of the target marks from the redundant image captures of the adjacent entocentric cameras additionally using a height position of the target marks which is determined by triangulation of a distance of the substrate surface (21).

20 Claims, 9 Drawing Sheets

(56) References Cited

U.S. PATENT DOCUMENTS

| | | | |
|---|---|---|---|
| 6,806,945 | B2 | 10/2004 | Ise et al. |
| 2004/0223129 | A1 | 11/2004 | Ishikawa et al. |
| 2007/0242317 | A1 | 10/2007 | Hashiguchi et al. |
| 2011/0069154 | A1* | 3/2011 | Case ................ G01N 21/9501 |
| | | | 348/46 |
| 2012/0327215 | A1 | 12/2012 | Case et al. |

FOREIGN PATENT DOCUMENTS

| | | |
|---|---|---|
| DE | 102019128198 B3 | 2/2021 |
| EP | 0722123 A1 | 4/1999 |
| EP | 0951054 A1 | 10/1999 |
| EP | 0954768 A1 | 4/2005 |
| EP | 2775349 A1 | 8/2021 |
| JP | 2010181519 A | 8/2010 |
| WO | 03094582 A2 | 11/2003 |
| WO | 2016115536 A2 | 7/2016 |

\* cited by examiner

EXPOSURE CONTROL IN PHOTOLITHOGRAPHIC DIRECT EXPOSURE METHODS FOR MANUFACTURING CIRCUIT BOARDS OR CIRCUITS

The invention is directed to a device for exposure control in photolithographic direct exposure processes for two-dimensional structures in photosensitive coatings, preferably on printed circuit boards, display substrates or wafers, and to a method for converting registration data into direct exposure data, particularly for adjusting the registration to uneven substrates and conversion thereof as a result of "on-the-fly" registration.

"On-the-fly" registration as used herein means that the position data of target marks and, accordingly, the position of the substrate to be processed and unevenness thereof are successively detected directly during the continuous movement of the substrate and are made available for aligning the exposure pattern with the substrate by adjusting the exposure data for the immediately following direct exposure. The field of application of the invention is particularly in the electronics industry and the semiconductor industry in the production of printed circuit boards, displays and chips.

Exposure systems for disk-shaped or plate-shaped workpieces which can write a predetermined pattern on an exposure object by means of electromagnetic radiation, chiefly in the visible or ultraviolet spectral region, with a laser beam or with an electron beam or particle beam are known from the prior art. The exposure is initiated after first producing the correct positional relationship between the exposure object with marks (target marks or targets) located thereon and a predetermined pattern stored in the exposure device. To this end, the target marks located on the exposure object are detected by one or more cameras, and the exposure object and exposure pattern are aligned with one another in front of or inside of the exposure area.

Exposure processes which are to be carried out with high spatial precision and the time for handling and aligning the plate-shaped workpieces that is required for these exposure processes are the limiting factors for increasing throughput for the production of conductive traces or very small electronic structures on plate-shaped substrates such as printed circuit boards, display substrates or wafers. For this reason, it is attempted to carry out the handling steps and exposure steps in an overlapping manner or simultaneously and to cut down on idle times during the exposure process with the front side and back side being exposed in the desired manner in the same device. Such solutions are disclosed, for example, in EP 0 951 054 A1, EP 0 722 123 B1, U.S. Pat. No. 6,806,945 B2 and JP 2010-181519 A.

A further challenge in the direct exposure process consists in enabling registration independent from the type, quantity and position of target marks (targets) on the exposure object and independent from height deviations in the object surface.

A solution for detecting surface topographies is known from WO 2016/115536 A2 in which a known two-dimensional pattern is projected on or otherwise applied to the surface and is captured two-dimensionally together with the surface, and the three-dimensional shape of the surface is determined based on the distortion of the pattern through unevenness in the surface. However, owing to the limited resolution, this method is not suited for detecting poorly differentiated irregularities.

EP 0 954 768 B1 describes a device for focusing on surfaces of a semiconductor wafer in which the actual surface topography for a semiconductor wafer is captured prior to exposure in an exposure installation. For this purpose, the surface is detected by a distance sensor two-dimensionally as height information, and periodic height variations are subsequently determined and stored. Based on the determined periodic height variations, an optimized focus position for the exposure optics is determined for the sub-regions of the wafer surface which are to be exposed, and the wafer is correspondingly aligned. The time-consuming acquisition of height information by means of the distance sensor and the subsequent alignment of the wafer are disadvantageous.

WO 03/094582 A2 discloses a further registration control for the exposure of substrates, particularly in laser direct exposure on multi-layer PCBs (printed circuit boards) in which a digital control image is generated by non-uniform modification of a representation of the electric circuit in such a way that an electric circuit pattern which is imprinted on a substrate using the digital control image exactly fits an already existing circuit portion. To this end, the registration of selected reference marks is carried out on an existing actual structure. Based on discrepancies between the actual positions and reference positions in the spatial directions, the reference structure to be exposed is corrected so that the exposure is carried out with a modified scanning raster. Because a camera installed in the exposure head is used for registration, every reference mark must be approached by relative movements between the substrate and scanning head in a disadvantageous manner.

Known from DE 10 2018 132 001 A1 is a device for processing plate-shaped workpieces with high workpiece throughput for use in the direct exposure of printed circuit boards in which the registration unit is outfitted with two or three area cameras which are displaceable laterally with respect to the movement of the printed circuit boards for detecting target marks when the positions of the target marks on the printed circuit board are known beforehand. The cameras are alternately arranged in parallel position relative to a processing path for registration of printed circuit boards with two tables moved on the same rail system in order to minimize cycle times for the processing of printed circuit boards by reducing the handling times and idle times. The cameras are arranged at regular intervals along the edge areas of the printed circuit boards or circuits of a PCB panel in which the target marks are knowingly expected. The detection of arbitrarily positioned target marks which are increasingly necessary in printed circuit boards and wafers is only possible with a decrease in throughput because of the required camera displacements, and height variations of the substrate surface cannot be detected at all.

EP 2 775 349 A1 describes a method for determining a correct focus position in a vision inspection system in which a difference between the focus position of the inspection system and the position of an object to be inspected is determined. An image of the object is captured independent from the correct focus position. An algorithm of the inspection system can calculate the magnitude of the difference and direction of the deviation between the focus position and the position of the object based on features of the captured image by matching the position of the object with the focus position of the inspection system corresponding to the difference and the direction. In the method, which is described for a sample to be microscopized in which various characteristic objects are to be found which can have different spatial extension and therefore substantial differences in height in the observed surface, a single adjustment of the focus position is required in order to be able to clearly detect the various objects. A detection of the height profile over the entire surface is not provided.

U.S. Pat. Nos. 6,245,585 B1 and 6,449,029 B1 describe methods and apparatus for adjusting the focus position in photolithography of a semiconductor wafer. Prior to exposure, the height of the surface is measured in z direction in each individual sub-portion of the wafer to be exposed. The sub-portions are rectangles which are arranged in a raster shape and exposed consecutively. The reflections of five obliquely incident laser beams are detected at the surface of each sub-portion, one of which laser beams is directed to the center while the remaining four are directed, respectively, to one of the corners of the sub-region. Offset values by which the vertical position of each sub-region deviates from a reference height can be determined from the position of the reflections, and a surface angle can be calculated for each sub-portion. An alignment of the wafer is then carried out in accordance with the stored values prior to the exposure of each sub-portion. The alignment is carried out by means of individually controllable actuators by which height and angle are adjusted. However, only an averaged correction over the entire sub-region can be adjusted for each sub-region.

In the not-prior-published DE 10 2019 128 198.9, there is described a device for introducing patterns on a wound continuous substrate by means of radiation in which the target mark registration and the pattern exposure take place on a continuous substrate which is tautly guided on a processing drum. When the registration unit and processing unit are located diametrically opposite one another at the drum, a height change of the substrate due to the drum curvature can be utilized for adjusting and focusing the cameras of the registration unit and of the processing beam by moving the drum longitudinally with respect to the movement direction of the substrate. However, a measurement of the magnitude of defocusing requires additional means by which the absolute position of the substrate surface can be determined.

US 2004/0223129 A1 discloses an exposure device for two-dimensional exposure of photosensitive material which is moved in a plane relative to an exposure device having a plurality of identical exposure heads arranged in a matrix. The light of a light source is modulated in each of the exposure heads to form a two-dimensional pattern which is projected on the material surface for the exposure by means of telecentric optics. To compensate for unevenness at the various locations of the material surface, each exposure head has a pair of wedge prisms in the beam path by which the optical length between the objective lens and the material surface is adjusted when distance sensors have detected unevenness because of a changed location of the material surface based on reflected laser radiation. A drawback consists in the individual tracking for each exposure head and the image field thereof as individual image segment, which can lead to erratic changes in the imaging scale in adjacent image segments.

The object of the invention is to find a novel possibility for improved exposure control in direct exposure methods for two-dimensional structures in photosensitive layers of printed circuit boards or wafers which permits an on-the-fly registration of target marks independent from defined locations of the target marks and which avoids the use of expensive telecentric objective lenses. An expanded object consists in achieving a flexible adjustment of the exposure pattern also for determined unevenness of the substrate.

In a device for exposure control in photolithographic direct exposure of two-dimensional structures in photosensitive coatings on a substrate, comprising a registration unit for the registration of target marks located on a substrate surface, a movable table system for the support of and defined one-dimensional movement of the substrate under the registration unit, a processing unit with a controllable linear processing path for the photolithographic processing of the substrate by means of a processing beam for introducing the two-dimensional structures and a computer unit for controlling the alignment between the processing path and the substrate by means of local adjustment of the photolithographic processing depending on the position of the substrate determined by registered target marks, the above-stated object is met according to the invention in that a plurality of entocentric cameras are arranged in the registration unit in linear alignment transverse to the one-dimensional movement of the substrate to form a gapless linear scanning area over a predetermined width of the substrate and have angles of view extending in direction of the linear scanning area, the angles of view of adjacent entocentric cameras having an overlapping region along the linear scanning area in order to detect redundant image captures of the substrate of the adjacent cameras in the overlapping region, and in that the computer unit has means for calculating the position of the target marks from the redundant image captures in the overlapping region (13) of the adjacent entocentric cameras additionally using a height position of the target marks which is determined by triangulation of a distance of the substrate surface.

The registration unit is advantageously so outfitted with a plurality of entocentric cameras for generating the linearly continuous, gapless sensor area that angles of view of adjacent cameras have an overlapping region which is at least as large as one half of the angle of view. The computer unit is adapted to determine target marks positioned anywhere over the width of the substrate independent from the position of the target mark inside of gaplessly successive overlapping regions of the angles of view of adjacent entocentric cameras by triangulation of a distance at any positions of the substrate surface.

The cameras are preferably line cameras so that the line-shaped scanning area is formed narrow, gapless and with overlapping regions over the entire width of the substrate through cameras with a large scanning length.

The cameras are advisably directed to the substrate surface with optical axes parallel to one another, the overlapping regions of the angles of view of all of the cameras being of equal size.

In another advantageous construction, two adjacent cameras are directed to the substrate surface with optical axes at an inclination to one another, the overlapping region of the angles of view of the cameras which are inclined relative to one another being adjusted in such a way that the angles of view of the two cameras completely overlap on the substrate surface.

The overlapping region which is formed by cameras which are inclined relative to one another by pairs gaplessly adjoins at least one further overlapping region until the overlapping regions have an extension which corresponds at least to the width of the substrate. An overlap can be provided between pairs of cameras which are inclined relative to one another in order to ensure a gapless scanning area of the registration unit for all permissible height variations $\Delta z$ of the substrate surface. The cameras which are inclined relative to one another in pairs are preferably arranged in such a way that they are subject to a Scheimpflug condition.

In an advantageous construction of the invention, the computer unit additionally has a control for a fast focus tracking of the processing unit along the processing path depending on height variations Δz of the substrate surface, which comprises a triangulation of target marks or any imaged structures of the substrate surface on the basis of redundant image captures in the overlapping region of adjacent entocentric cameras.

In a further preferred variant, the registration unit has only two entocentric cameras for the detection of target marks, which cameras are arranged on a scanning line transverse to the movement direction of the substrate with an overlapping region of from one one hundredth to one third of the angle of view of the camera when the substrate, as flexible continuous substrate, is guided tautly and without height variations Δz on a rolling table system, the overlapping region of the angles of view of the two cameras being configured such that the triangulation is applicable for purposes of the accurate determination of the thickness of the substrate in the overlapping region of the angles of view on the rolling table system and can be assumed to be constant for the entire width of the rolling table system.

Further, the registration unit is advisably outfitted with light sources for illuminating the linear gapless scanning area which are arranged so as to be uniformly distributed in the housing to realize a scanning line which is homogeneously illuminated by darkfield or brightfield illumination. The light sources are configured for a continuous illumination and have an arrangement for controlling at least one characteristic including brightness, incident angle or spectral region.

Further, the light sources can be adapted for a continuous illumination in order to enable image captures by controlling the integration time of the sensor lines by means of an electronic shutter principle.

In a further preferred construction of the invention, a focus tracking for height variations Δz of the substrate is integrated in the processing unit. With this focus tracking, height variations Δz determined by the computer unit by means of triangulation from images redundantly captured by two adjacent cameras of the registration unit are adjustable in real time by fast focus correction for each image point of the registration unit, and the focus tracking is controllable based on changes in a lens position, mirror position or mirror curvature.

The focus tracking is advantageously controllable based on the change in a mirror curvature at least in transverse direction x relative to the movement direction y of the substrate. The focus tracking can preferably be separately controllable based on changes in a mirror curvature in movement direction y of the substrate and a mirror curvature in transverse direction x. In an advisable embodiment, the focus tracking is controllable through change in the mirror curvature by means of a piezoelectric element.

The focus tracking can advantageously be applied based on changes in a lens position or mirror position or mirror curvature for correcting image-dependent focus deviations of upstream focusing optics or other upstream optical elements resulting from the optical design or optical fabrication.

The above-stated object is further met in a method for exposure control in photolithographic direct exposure of two-dimensional structures in photosensitive coatings on a substrate having the following steps:

arranging a plurality of entocentric cameras to form a gapless linear scanning area transverse to a movement direction of the substrate in a registration unit for detecting target marks located on the substrate, the entocentric cameras having angles of view extending along the linear scanning area with an overlapping region formed by adjacent entocentric cameras in order to obtain redundant image captures of the substrate in the overlapping region from adjacent cameras, moving the substrate on a movable table system in a defined one-dimensional movement below the registration unit, providing a processing unit for the photolithographic production of two-dimensional structures with a processing beam which is controllable along a linear processing path, detecting the spatial position with respect to length position, width position and a height position of target marks arbitrarily distributed over a given width of the substrate during one pass of the substrate through the linear scanning area of the registration unit, determining the positions of the target marks arbitrarily distributed over the width of the substrate from the redundant image captures in the overlapping region of the adjacent entocentric cameras additionally using a height position of the target marks which is determined from the redundant image captures of adjacent entocentric cameras by means triangulation of a distance of the substrate surface, calculating data for the alignment and local adjustment of the processing of the substrate with two-dimensional structures for the processing unit for controlling the processing beam along the linear processing path which is oriented transverse to the movement direction of the substrate, and controlling the alignment between processing path and substrate and local adjustment of the photolithographic processing depending on the position of the substrate determined by means of registered target marks.

In a preferred method variant, the calculation of the spatial position of target marks arbitrarily distributed over the width of the substrate is extended based on a height position to the triangulation of further detectable structures of the substrate in the redundant images captured in the overlapping region during a passage of the substrate, and a fast focus adjustment of the focus of the processing beam is carried out by means of a focus tracking along a processing path based on a control of a lens position or mirror position or a mirror curvature.

The fast focus adjustment of the focus of the processing beam is advantageously carried out at a frequency which is at least two to three times higher than the conventional scanning frequency for the processing beam.

The invention is based on the fundamental consideration that one or more cameras with two-dimensional sensors (e.g., CCD cameras, CMOS cameras) which are usually outfitted with telecentric objectives and arranged exactly perpendicularly above defined portions of substrates are used for the registration systems. Accordingly, the detected positions remain constant within the available depth of focus of telecentric cameras even if the focus position of the objective shifts with respect to the substrate due to changes in thickness or topography. For reasons relating to construction, telecentric objectives are comparatively expensive and so bulky that the mechanical dimensioning of an objective lens must always be larger than the image field to be captured. Therefore, telecentric objectives do not permit gapless image captures by a plurality of cameras positioned along a straight line; rather, they would have to be arranged offset along a plurality of parallel lines for this purpose.

Moreover, an inherent determination of height deviations of the substrate, which acquires considerable significance for highly accurate determination of the target mark position and for the accurate alignment and adjustment of the exposure pattern, is not possible.

The invention solves these problems through a combination of a kind of line-shaped image scanning over the entire substrate width (hereinafter FPSS [Full Panel Scan System]) during a progressive relative movement between substrate and line-shaped scanning area by cameras with entocentric objectives, the angles of view of which overlap to the extent that a triangulation of height differences is possible from a plurality of camera images of different cameras for each substrate position of the linear scanning area, or by means of a defined arrangement of multiple cameras positioned obliquely with respect to the substrate which allows a complete overlapping of the angles of view of two adjacent cameras while complying with a Scheimpflug condition and which accordingly allows a triangulation for each substrate position of the linear scanning area from only two camera images.

Definitions from the field of photography are used for "angle of view" within the meaning of the present invention. Thus the angle of view is understood as that angle in the object space limited by the edges of the camera format (in this case, the camera of the registration unit). Accordingly, the angle of view is determined in this case by the height and width of the camera format (in contrast to the diagonal which is also often used and which specifies the maximum angle of view independent from the actually used aspect ratio of the camera format). The camera format is predetermined by the sensor format, for which reason an object-side field of view (FOV) is defined via the objective lens imaging as that object space subtended by the horizontal and vertical angles of view.

Apart from the image format-height H and width B of the camera format—the angles of view are determined substantially only by the actual focal length f of the objective. However, the focal length f can be used for directly defining the angle of view only when the objective is adjusted to "infinity" (object-side telecentric objective). When imaging objects at a finite object distance (short object distance), the image distance b is greater than the focal length f and substitutes for the latter so that the following horizontal angle of view is given for the width B of the camera format $$\alpha = 2 \cdot \arctan [B/(2 \cdot b)] \quad (1).$$

When using line cameras, the horizontal angle of view according to equation (1) is the definitive angle of view of the camera because of the virtually linear sensor format and can therefore be used by itself to define the linear object-side field of view.

The height deviations of the substrate which are determined along the scanning line with entocentric cameras through local triangulation are usable not only for the precise two-dimensional registration of target marks but also, in addition, for a point-accurate tracking of the focus position of the processing beam which is moved linearly along a processing path. The tracking of the processing beam along the processing path for the usual alignment of the exposure pattern with the registered target mark positions can be additionally supplemented by adjusting mechanisms for the fast focus change of the processing beam based on the detected height variations. The focus change must be carried out at a frequency at least twice to ten times the usual scanning frequency of the processing beam (between 0.5 and 1 kHz in polygon scanners) and must therefore be controllable by means of simple linear position changes or a change in radii of curvature of lenses or mirrors.

The invention realizes a novel possibility for improved exposure control in direct exposure processes for two-dimensional structures in photosensitive layers on printed circuit boards or wafers which permits an "on-the-fly" registration of target marks by means of a linear scanning area independent from fixed spatial specifications of the target marks for defined exposure fields and avoids the use of expensive telecentric objectives and makes possible a flexible alignment and adjustment of the exposure pattern also for determined unevenness of the substrate.

Figure 2:
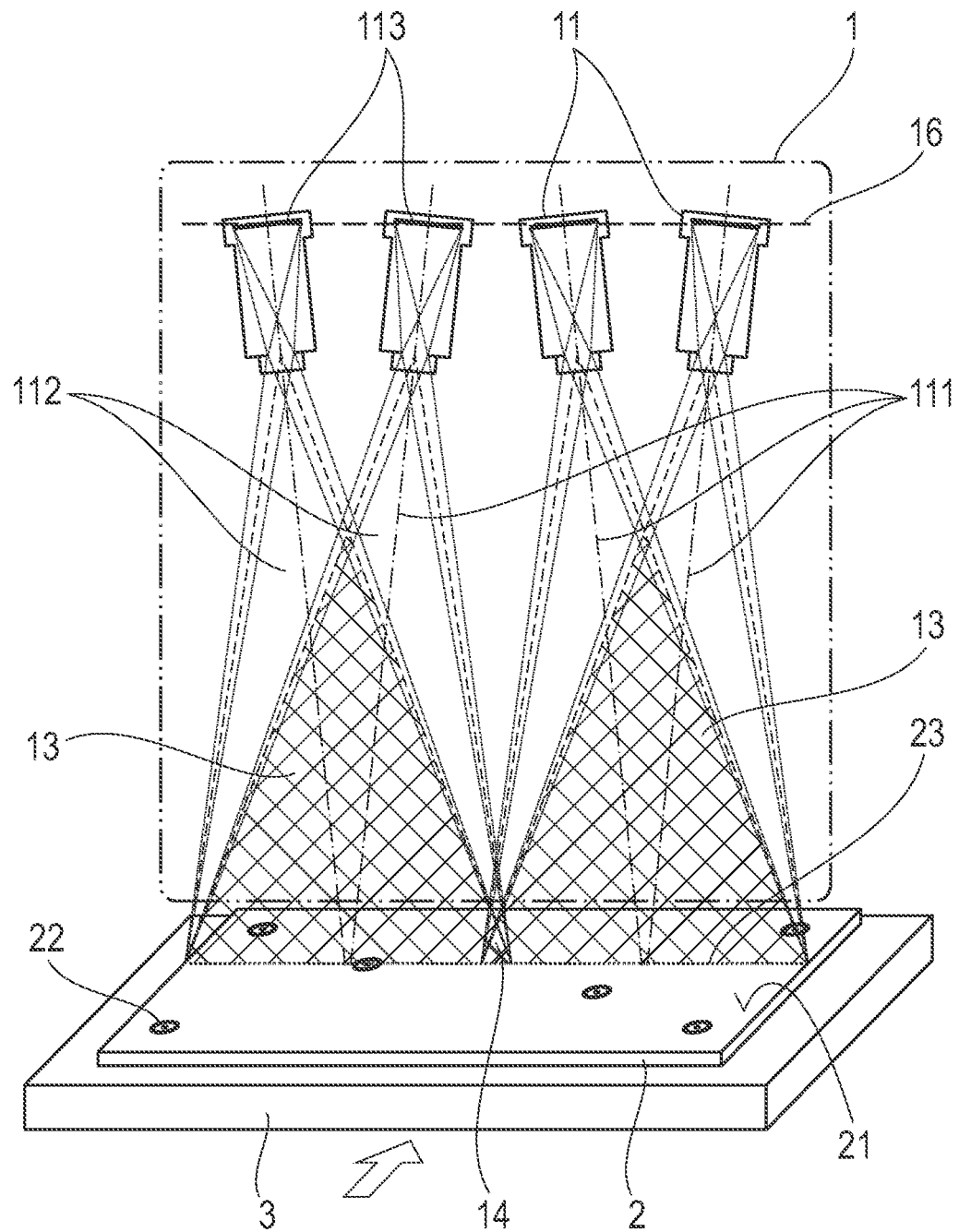
Figure 3:
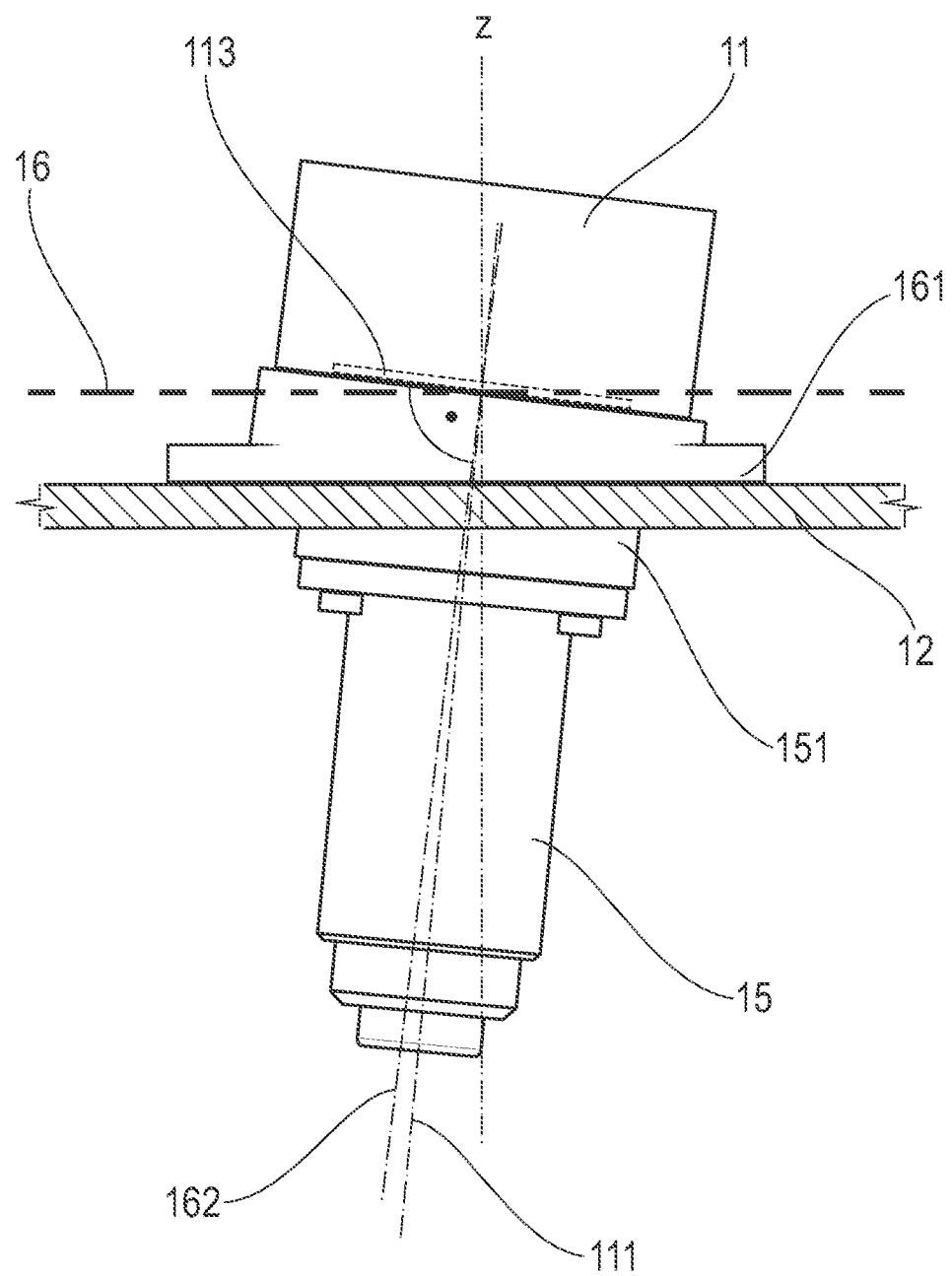
Figure 4:
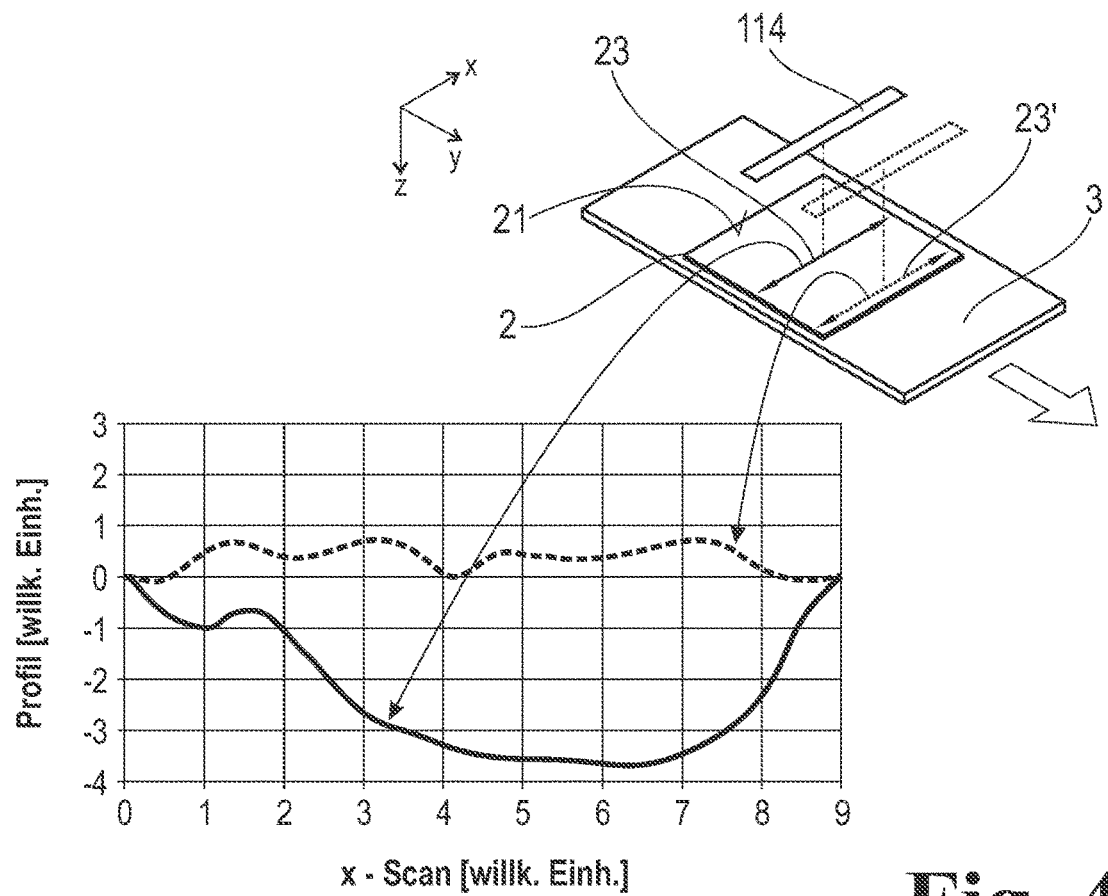
Figure 6:
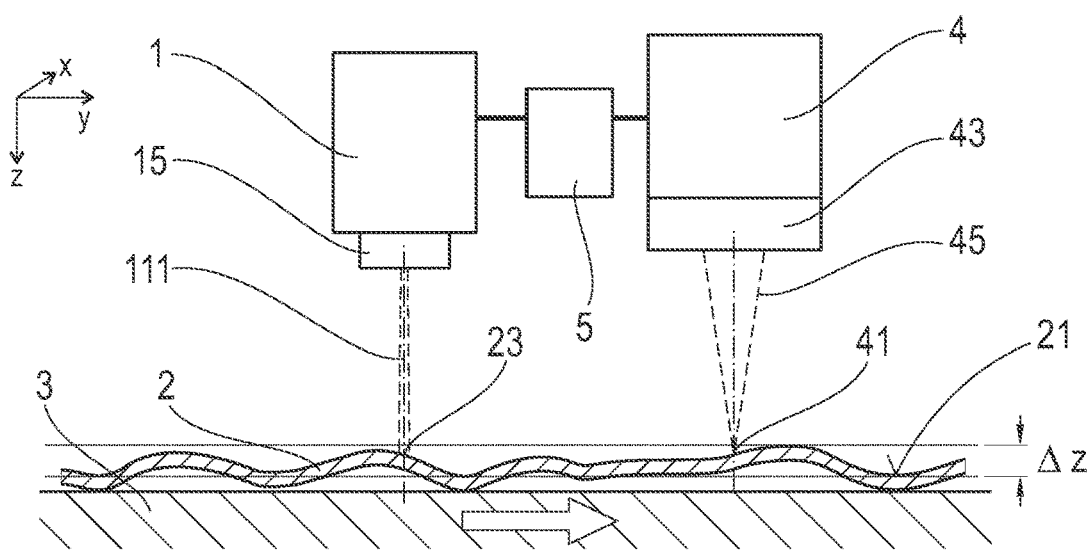
Figure 5:
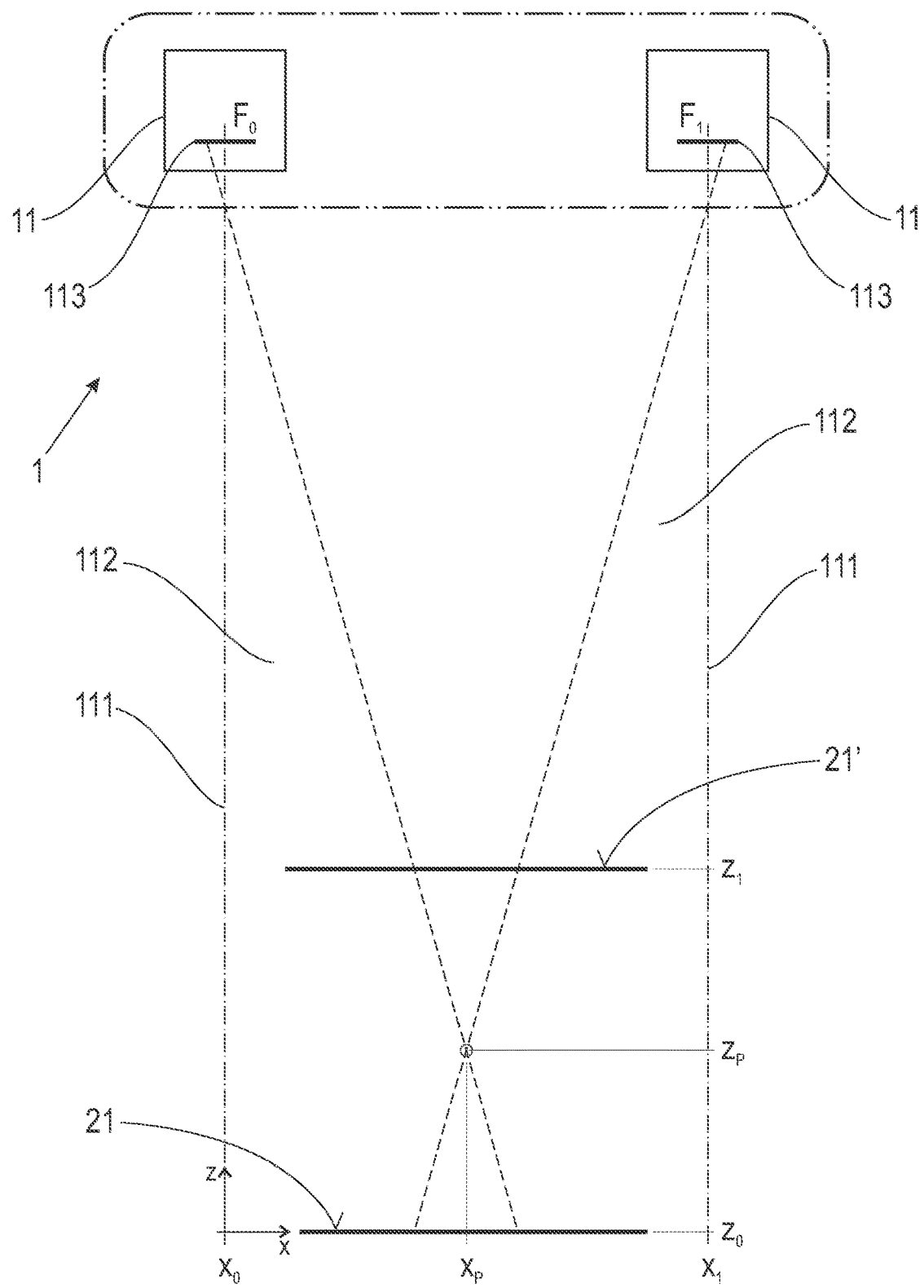
Figure 7:
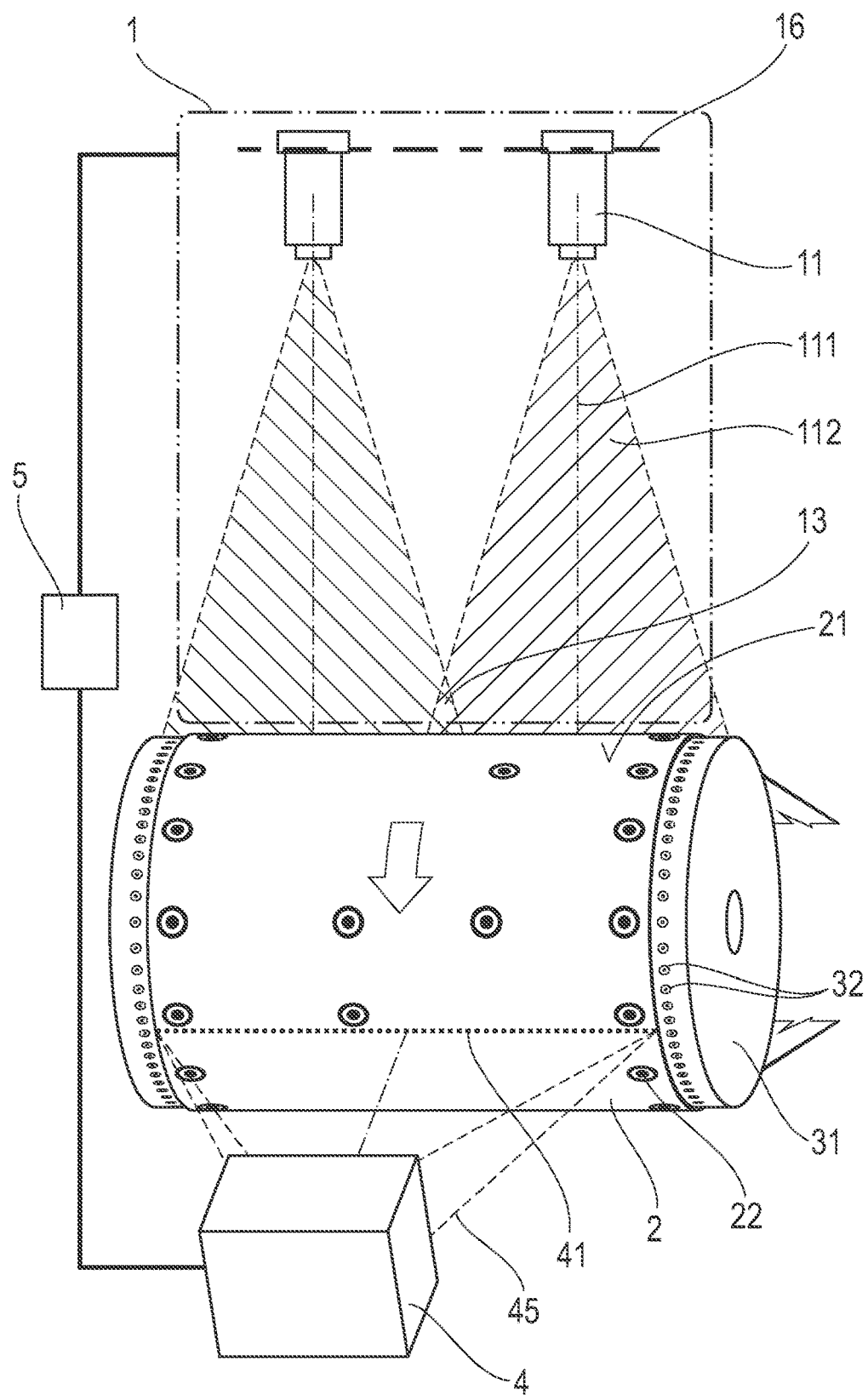
Figure 8:
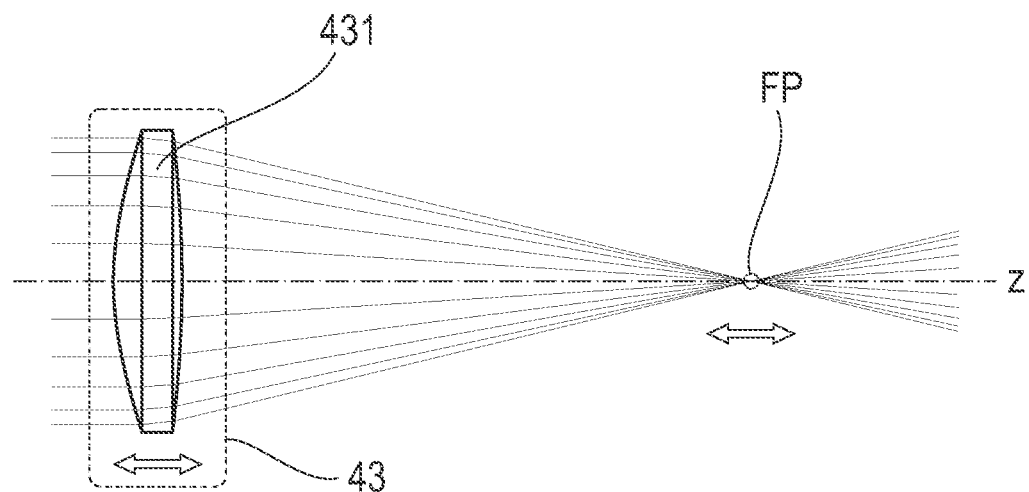
Figure 9:
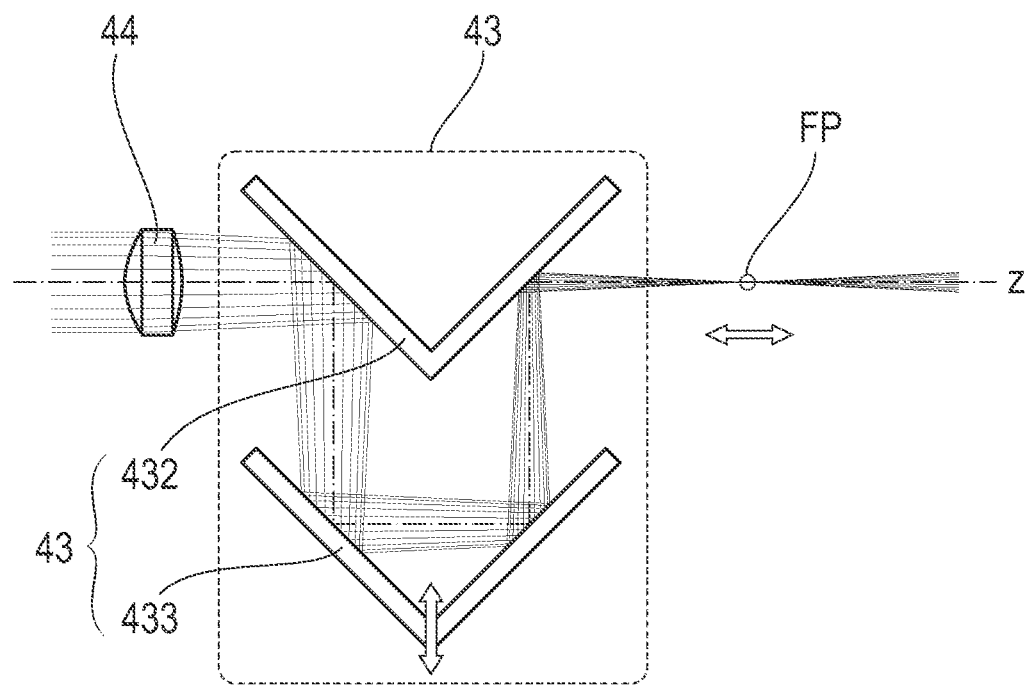
Figure 10:
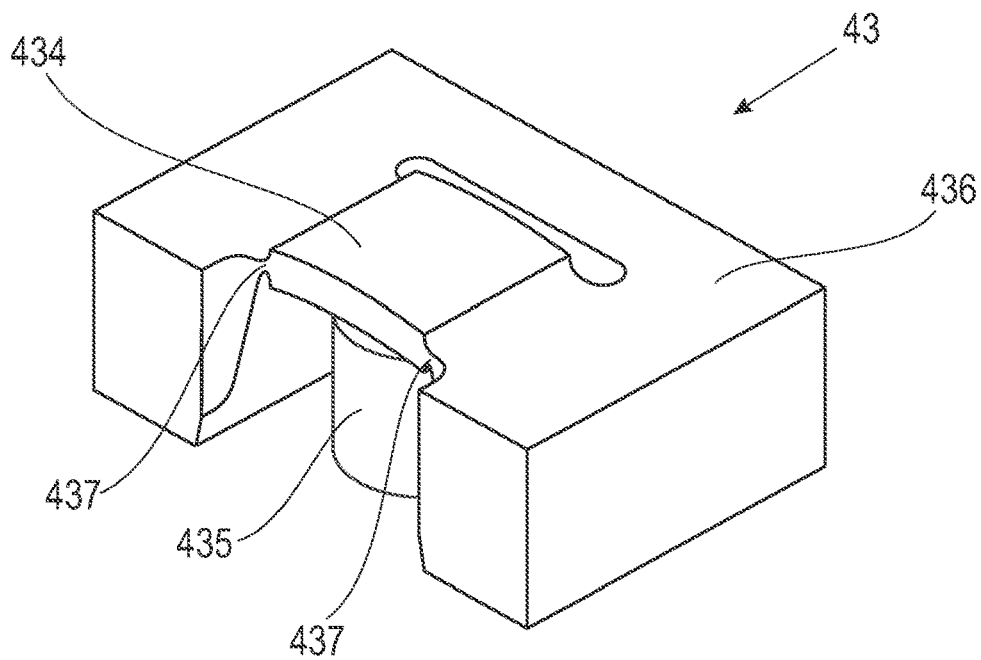
Figure 11:
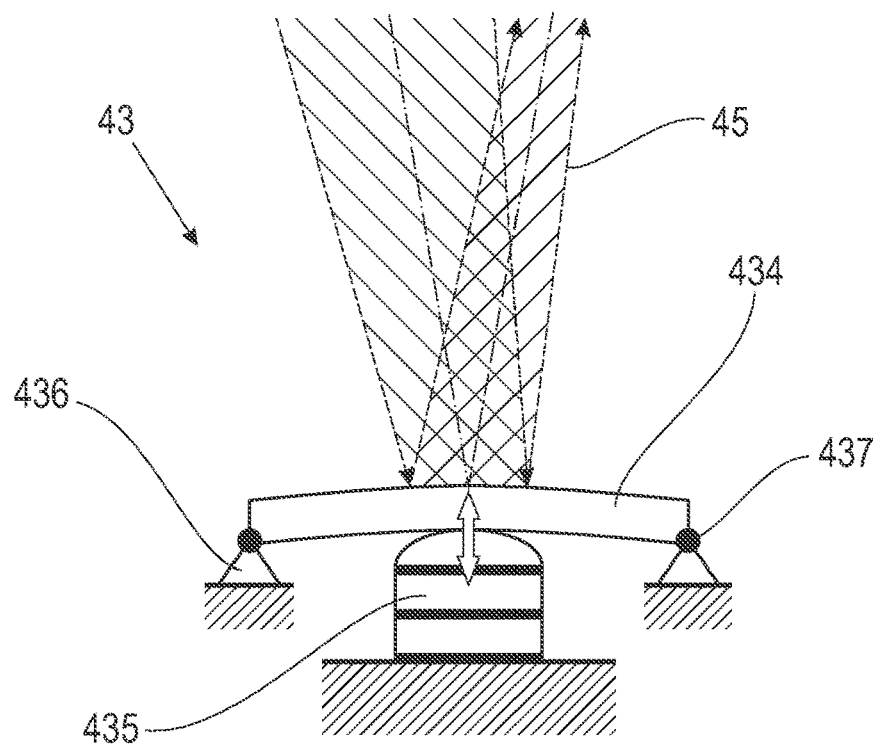
Figure 12:
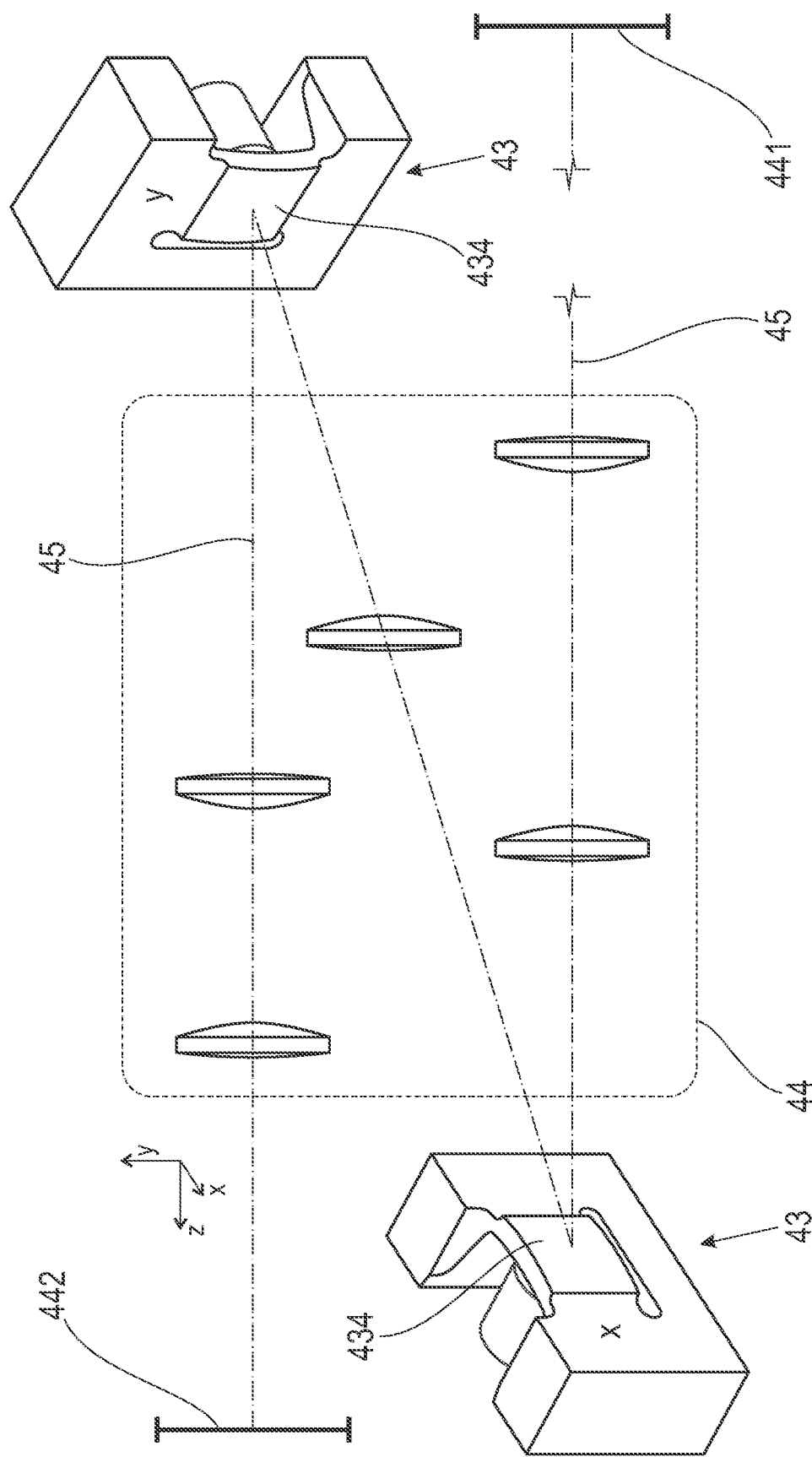

The invention will be described in more detail in the following referring to embodiment examples and illustrations. The drawings show:

FIG. 1 a schematic view of a registration unit for acquiring target marks, formed as a multiple camera configuration comprising a linear arrangement of entocentric cameras with overlapping image areas for achieving a line-shaped scanning area over the entire object width transverse to the object movement;

FIG. 2 a schematic view of the registration unit formed as a multiple camera configuration in which the linear arrangement of the cameras is formed with entocentric cameras which are inclined relative to one another by pairs and which satisfy a Scheimpflug condition and, by pairs, have a completely overlapping image area;

FIG. 3 a schematic diagram for the realization of the alignment of an entocentric camera under Scheimpflug conditions;

FIG. 4 a schematic perspective view of two selected consecutively executed line scans of the registration unit and a diagram showing the results of the height variation of the object along two selected line scans;

FIG. 5 a schematic diagram showing the triangulation method used for height measurement in the overlapping region of two adjacent entocentric cameras;

FIG. 6 a schematic depiction of the invention in a side view transverse to the movement direction of the object with magnified height variation of the substrate surface, wherein the registration unit is schematically connected to the processing unit via a computer unit for converting the height measurement carried out by triangulation into a point-accurate control of the focusing inside of the processing beam which is scanned orthogonal to the drawing plane;

FIG. 7 a schematic perspective view of the invention with registration unit and processing unit transverse to the substrate movement direction on a continuous substrate which is tautly guided on a rolling table system;

FIG. 8 a schematic diagram for the realization of the focusing control for the actual focus tracking by means of a movable objective lens;

FIG. 9 a schematic diagram for the realization of the focusing control for the actual focus tracking by means of a fixed angle mirror and a movable retroreflector;

FIG. 10 a perspective diagram of the implementation of an elastically bendable mirror element which changes the mirror curvature with a linear actuator;

FIG. 11 a schematic depiction of the bendable mirror element of FIG. 10;

FIG. 12 a schematic depiction of the realization of the focus tracking with an elastic mirror element according to FIG. 10 in each instance for the mirror control separately in movement direction and in transverse direction of the substrate.

In an advantageous basic variant according to FIG. 1, the registration unit 1 according to the invention comprises a plurality of cameras 11 which form a linear configuration such that the optical axes 111 thereof within the plane of the substrate 2 are directed to a line (scanning line 23, only shown in FIG. 1, FIG. 4 and FIG. 6) transverse to the movement direction of the substrate 2 which is guided past, and the substrate width passing through is completely covered by angles of view 112 or line-shaped fields of view of the cameras 11 which at least partially overlap one another. This is possible because the objective lenses 15 are entocentric rather than telecentric. Further, the cameras 11, as line cameras, are outfitted with one or a few sensor lines 114 arranged in parallel.

The arrangement of cameras 11 with individual sensor lines 114 (so-called line cameras, not shown in FIG. 1) is scalable, i.e., every required scanning width can be achieved by means of combining a plurality of cameras 11. Since the exact position of target marks 22 can be determined only in the overlapping region 13 of the angles of view 112 of two cameras 11, areas without overlapping are not subject to an exact measurement and only one half of the angles of view 112 of the cameras 11 can be used in the edge areas of the substrate 2 insofar as the overlapping regions 13 are limited to the one-half angle of view 112. Therefore, only the one-half angle of view 112 is shown in FIG. 1 for the cameras 11 in the edge area of the substrate 2.

The registration unit 1 is oriented with its elongated housing 12 transverse to the movement direction of the substrate 2 to be scanned for target marks 22 (only shown in FIG. 2 and FIG. 7), the substrate 2 being guided through and under the registration unit 1 on a table system 3 (shown only as support surface). As can be seen from the side view in FIG. 1, the registration unit 1 has intensive illuminating means at a short distance from the substrate surface 21. The illuminating means, as light sources 17, are so arranged that the illumination light thereof only illuminates the substrate 2 without giving off direct light in direction of the cameras 11, and the illumination can take place under different oblique incident angles (darkfield illumination) and possibly with different spectral colors. Alternatively, it is also possible that the light of the light sources 17 is coupled into the recording beam path of the cameras 11 directly as brightfield illumination (not shown).

The camera configuration selected in FIG. 1 comprises five cameras 11 with optical axes 111 aligned parallel to one another and relatively large overlapping regions 13 of the cameras 11 which correspond to one half of the angle of view 112 of each camera 11. In this way, a gapless, approximately line-shaped scanning is achieved over the full width of the substrate 2 such that it is possible to detect all of the target marks 22 located along the substrate width with one scan without mechanical camera movement when the substrate 2 is moved transversely as indicated by the arrow in the side view of FIG. 1 shown on the right-hand side. A virtually line-shaped scanning is realized by the registration unit 1 in that the latter is outfitted with cameras 11 in the form of line cameras. In order to generate a line-shaped scanning area transverse to the movement direction of the substrate 2, the entocentric cameras 11 must be directed to the substrate surface 21 with optical axes 111 lying in a plane (not shown) on a scanning line 23 (shown only in FIG. 2) such that their angles of view 112 overlap thereon and form the overlapping regions 13 along the scanning line 23.

With the usual substrate widths of 500 to 635 mm, entocentric cameras 11 (in the form of line cameras) with a scanning length of 330 mm in the focus area can be used for the currently required resolution (8 to 12 μm/pixel on the substrate 2) so that a registration unit 1 outfitted with five cameras 11 can completely cover the entire width of the substrate with a 165 mm distance of the optical axes 111 of the cameras 11 in direction of the substrate width (transverse dimension of the substrate 2), every location on the scanning line 23 being acquired simultaneously and redundantly in two different camera images of adjacent cameras 11. In this example, the five cameras 11 directed to the scanning line 23 give a total scanning length of 660 mm and can be moved closer together to ensure a gapless double-scanning even in case of positioning tolerances or mounting tolerances of the cameras 11 and/or height variations Δz of the substrate 2 because the at-the-current-time maximum substrate width (635 mm) is exceeded by 25 mm and additional slight overlaps 14 of the overlapping regions 13 and a reliable scanning beyond the edge areas of the substrate 2 are accordingly possible.

With the above-described arrangement of cameras 11 according to FIG. 1, a scanning area which is actually line-shaped and has a length/width aspect ratio of more than 2000 can be scanned along the scanning line 23. The registration unit 1 can generally have a scanning line 23 with a length/width aspect ratio of from more than 1000 to 100,000. The scanning width in movement direction y of the substrate 2 can be adjusted by electronic control (synchronization) of the readout modes and speeds of the cameras 11 by means of the computer unit 5.

The cameras 11 which are arranged according to FIG. 1 with optical axes 111 parallel to one another are arranged so close together along the scanning line 23 (shown only in FIGS. 2, 4 and 6) that adjacent cameras 11 form an overlapping region 13 of at least one half of the angle of view 112 with one another and there is a further only slight overlap 14 with the angle of view 112 of the next closest camera 11 if, in the case of three or more cameras 11, a gapless coverage of the substrate surface 21 with the overlapping regions 13 is also to be guaranteed in case of height variations Δz of the substrate 2 and inaccurate mechanical alignments.

Owing to the fact that the optical axes 111 of the cameras 11 are aligned perpendicular to the substrate 2, only one half of the angle of view 112 is usable at the edges of the substrate 2 or of the scanning line 23 formed by the cameras 11 in order that there is also always an overlapping region 13 in the edge area of the substrate 2. This is necessary because, with entocentric cameras 11, the localization of a target mark 22 present on the substrate 2—the greater the distance of the target marks 22 from the optical axis 111—in the camera imaging depends in a very sensitive manner on the distance of the substrate surface 21 from the focal plane $F_n$ (shown only in FIG. 5) of the respective camera 11. Therefore, to determine the distance of a target mark 22 arbitrarily positioned on the surface 21 of the substrate 2, a triangulation is carried out from two camera images of adjacent cameras 11 along the scanning line 23 and can also be continued for every other point of the scanning line 23 insofar as there are analyzable structures—apart from the target marks 22—on the substrate 2.

In z direction, the exact determination of height variations Δz of the substrate surface 21 is limited to regions with detectable points (analyzable structures) and the height profile of the substrate 2 must be supplemented, as the case may be, by interpolated values.

The triangulation of the distance of the substrate surface 21 is critical for determining the scanning location of a target mark 22 because, the closer this target mark 22 comes to the edge of the angle of view 112 of the camera 11, any height variations Δz of the surface 21 of the substrate 2 can lead to substantial measurement errors when determining the x and y coordinates of a target mark 22.

Light sources 17 which are positioned at a slight distance from the substrate 2 in the housing 12 of the registration unit 1 and are arranged at various oblique angles of incidence are provided for the selective illumination of the scanning line 23 which is defined by the points of incidence of the optical axes 111 of the cameras 11.

As has already been mentioned above, one half of the image capture area (angle of view 112) may not be used by the outside cameras 11 in the camera arrangement according to FIG. 1. The above-mentioned disadvantages can be avoided and optimum use can be made of the scanning areas inside the entire angle of view 112 of each of the adjacent cameras 11 which are inclined relative to one another by means of an alternative system arrangement, shown in FIG. 2, which is based on the Scheimpflug principle. However, there are increased demands on the objectives 15 and the orientation and adjustment of the cameras 11.

While a first gapless registration principle according to FIG. 1 uses five cameras 11 for a total detection width of >635 mm (>25"), the same detection width of the registration unit 1 can be scanned with only four cameras 11 in the arrangement principle according to FIG. 2.

The detection width over all of the cameras 11 is dimensioned such that it is greater than the maximum processing area of the processing unit 4 (only shown in FIG. 6 and FIG. 7), i.e., greater than the maximum length of the processing path 41 on the substrate 2 generated, for example, by a processing beam 45 (only shown in FIG. 6 and FIG. 7) scanned by means of a polygon scanner.

A second condition for the quantity and arrangement of the cameras 11 is the required object-side optical resolution which is often fixed at approximately 10 µm/pixel depending on the size of the target mark to be detected and is realized in the suggested examples at approximately 11 µm/pixels. A third boundary condition relates to the scanning speed which is to be adapted to the desired throughput of printed circuit boards at a substrate speed of 1000 mm/s to 1800 mm/s.

As a compromise between high readout speed, maximization of scanning width based on long line length and acceptable price of the sensor lines 114, line cameras with sensor lines 114 having more than 3000 pixels and 11 µm×11 µm edge length are chiefly used for the cameras 11. The adjustment of the required width of the substrate 2 to the resolution of the line camera is carried out by means of the imaging scale of the objectives 15 of the cameras 11.

In contrast to FIG. 1, FIG. 2 shows a configuration of four cameras 11 which have optical axes 111 inclined relative to one another in a uniform camera plane along the scanning line 23 to enable gapless registration of target marks 22 for the same scanning area as in FIG. 1 (635 mm). Two cameras 11 form a pair of cameras 11 which are positioned in accordance with the Scheimpflug condition and which together have a larger overlapping region 13 of their angles of view 112 which preferably corresponds to a complete overlapping of the angles of view 112 of the two cameras 11.

If the substrate 2 is not wider than this scanning line 23 from the angles of view 112 of the two adjacent cameras 11, the triangulation for each substrate point along the scanning line 23 can be calculated from the two camera scans of only two adjacent cameras 11 which are inclined relative to one another. Otherwise, if the substrate width is larger, further cameras 11 inclined in pairs relative to one another can be lined up along the desired scanning line 23 until the overlapping regions 13 of the respective two cameras 11 cover the entire width of the substrate 2. In this regard, the overlapping regions 13 must at least meet one another but, because of possible height variations $\Delta z$ of the substrate 2 and because of mechanical mounting tolerances and alignment tolerances of the cameras 11, should also have a smaller overlap 14, which always ensures the gapless scanning of the scanning line 23 on the substrate 2 for maximum height variations $\Delta z$ and mounting tolerances of the cameras 11 by means of an additional overlapping 14 of the overlapping regions 13 of the respective pairs of cameras 11 which are formed by complete overlapping of the angles of view 112. The advantage of this camera configuration according to FIG. 2 consists in that, in the simplest case, exactly two cameras 11 "see" the same area of the scanning line 23 while adhering to the Scheimpflug conditions and no sub-regions of the angles of view 112 of the cameras 11 remain unutilized. Accordingly, one less camera 11 is used compared with FIG. 1 with the length of the scanning line 23 remaining the same, i.e., with the same substrate width.

At the same time, an additional height triangulation is possible for determining the height deviations $\Delta z$ of the substrate surface 21 with each pair of cameras 11 arranged in conformity with the Scheimpflug conditions if a sufficient number of target marks 22 or other scannable structures are present in the overlapping region 13.

FIG. 3 shows one of the two cameras 11 which are inclined relative to one another and in which the imaging of the object plane and image plane is rectified in that different angles of inclination of objective 15 and sensor chip 113 (or inclination of objective relative to camera if the latter is considered separately from the objective 15) are adjusted and satisfy a Scheimpflug condition.

In FIG. 4, a sensor line 114 is shown schematically as representative of a camera 11 of the registration unit 1 in order to illustrate the set of problems involved in a fluctuating height of the substrate surface 21 using the example of waviness of the substrate. The upper right-hand portion of FIG. 4 schematically shows a table system 3 which moves in y direction and on which a substrate 2 is placed. The registration unit 1 which is reduced to a sensor line 114 and which carries out a registration of target marks 22 (shown only in FIG. 2 and FIG. 7) along the scanning line 23 is located above the substrate 2. For a substrate 2 which is to be scanned for target marks 22, it is assumed or is known that it is either unstable or lies in an undulating manner resulting in height variations $\Delta z$ of the substrate surface 21. During an advancing relative movement of the sensor line 114 in y direction, different heights are recorded along the scanning line 23 (in x direction). Depending on the position of the target marks 22 in the angle of view 112 of the entocentric cameras 11, these different heights result in a less accurate determination of the x, y positions of the target marks 22.

As a result of the forward feed of the table system 3, the sensor line 114 first scans the dotted scanning line 23' resulting in the dashed profile line shown below in the diagram. A few readout steps later, the sensor line 114 detects the solid scanning line 23 and records a solid profile line which differs appreciably from the dashed profile line. These height variations $\Delta z$ which differ sharply in places can lead to considerable deviations of the exposed structures during the processing by the processing unit 4 (shown only in FIG. 6) which are caused by defocusing (propagation) of the processing beam 45. The defocusing can only be eliminated by means of refocusing when the locations of the height variations $\Delta z$ are precisely measured and the focusing of the processing beam 45 is tracked along a processing line 41 adapted to the positions of the target marks 22 and the height variations Δz.

FIG. 5 shows an example for the determination of the height variations Δz of the substrate surface 21 of the substrate 2 by means of triangulation in which two adjacent cameras 11 have parallel optical axes 111 and two focal planes $F_n$ and $F_{n+1}$ of the sensor chips 113 (shown here for n=0) lying in the same plane, and an overlapping region 13 of the angles of view 112 (i.e., of the linear scanning areas) of two cameras 11 occurs. This is necessary because the detected target mark positions in the x-y plane on the substrate surface 21 during the imaging by means of entocentric objectives 15 are sensitively dependent on the object position in z direction. Therefore, the detection of the target marks 22 to be registered is carried out with camera images of a pair of adjacent cameras 11 and the calculation of the target market positions x, z according to a triangulation method in which the height variation is related to two reference planes for the z direction. The lower plane is designated as substrate surface 21 and the upper plane for identifying the surface change is designated as substrate surface 21'.

Finally, the resulting x position and the resulting height z are determined as follows from the positions of the different calibration values $z_1$, $z_0$ detected in the two cameras 11 with respect to the calibration planes of substrate surfaces 21 and 21':

$$x_p = \frac{x_{1T}x_{0B} - x_{1B}x_{0T}}{x_{1T} - x_{1B} + x_{0B} - x_{0T}}$$

$$z_p = \frac{x_{0B} - x_{1B}}{x_{1T} - x_{1B} + x_{0B} - x_{0T}} \cdot (z_1 - z_0)$$

This means that in addition to the exact determination of the target mark positions in x position, the z position can also be determined in relation to the calibration planes $z_1$, $z_0$. An (absolute) height measurement is possible in this way.

FIG. 6 shows a side view of the registration unit 1 analogous to the sectional view on the right-hand side of FIG. 1 and the association of the determined position data of target marks 22 (shown only in FIG. 2 and FIG. 7) via a computer unit 5 with the processing unit 4 is shown schematically. The set of problems associated with an uneven substrate 2 is shown schematically and in an enlarged view for a wavy substrate surface 21. The table system 3 is assumed to be a precision table.

When the table system 3 moves in y direction, the registration unit 1 detects the x position and y position of target marks 22 arbitrarily arranged on the substrate 2 in a linear scanning area on the substrate 2 (scanning line 23 which is formed by a plurality of line cameras orthogonal to the drawing plane) by means of successive line scans. Because of the overlapping regions 13 of angles of view 112 (only visible in FIG. 1 and FIG. 2) formed by cameras 11, it is ensured as the result of a double scan of each substrate point by two adjacent cameras 11 that not only the exact target mark positions can be determined by means of triangulation, but also the height variations Δz of the substrate surface 21 can be calculated. In addition to the usual alignment of the two-dimensional structure of the processing pattern relative to the actual position of the target marks 22, the processing focus FP (shown only in FIGS. 8 and 9) of the processing beam 45 along the processing path 41 is then additionally adapted point by point by means of focus tracking 43 to the height variations Δz of the substrate surface 21 in the computer unit 5 from the measured values of the actual substrate height z in each point of the scanning line 23 that is detectable by means of imaged structures.

In the exemplary embodiment of the invention shown in FIG. 7, the substrate 2 is a continuous substrate which is tautly guided from roll to roll (not shown) via a roller table system 31. The roller table system 31 can have a drum diameter of between 200 and 500 mm.

Owing to the taught guiding of the continuous substrate 2, the scanning line 23 (not visible in FIG. 7) of the cameras 11 of the registration unit 1 can be arranged in front of the line of contact of the substrate 2 with the roller table system 31.

The registration unit 1 is formed with two entocentric cameras 11 in such a way that the scanning areas of the two cameras 11 form a scanning line 23 (not visible) which extends past the edges of the substrate 2 so that calibration marks 32 on the roller table system 31 can also be detected. As regards the need for and handling of calibration marks 32, reference is made to the not-prior-published DE 10 2019 128 198.9.

Otherwise, the registration unit 1 detects all of the target marks 22 located on the substrate 2 which is guided past by the roller table system 31 in the same manner as that described for flat substrates 2 referring to FIGS. 1 and 2 regardless of the location on the substrate 2 where the target marks 22 are located.

Due to the fact that the substrate 2, as continuous substrate, is stretched taut on the roller table system 31 and accordingly has no height variations Δz caused by waviness of the substrate 2, a local point-by-point height measurement can be dispensed with in this embodiment form of the invention, and the height measurement of the substrate surface 21 may be limited to a small overlapping region 13 of the angles of view 112 of the two cameras 11. In the overlapping region 13 which, in this case, can be much smaller than one half of the angle of view 112 of the two cameras 11 but at least 1/50 (>5 mm) of the detection area of the registration unit 1 (i.e., substrate width, including edge regions of the roller table system 31), preferably between 1/40 and 1/10, particularly preferably from 1/35 to 1/25 (approximately 10-15 mm), a triangulation calculation is carried out analogous to the description referring to FIG. 5, from which the thickness of the substrate 2 and possibly thickness variations over the entire length of the continuous substrate can be determined in this example. However, a fast focus change along the processing path 41 by means of the focus tracking 43 as described referring to FIG. 6 is generally not required. Nevertheless, the thickness information, i.e., the z measurement value as height of the substrate surface 21, is absolutely necessary for calculating the positions of the target marks 22 in x direction and y direction. However, after an initial one-time determination (and possibly an individual measurement that is occasionally repeated), it can be retained for the calculations of the positions of all target marks 22 of the entire continuous substrate.

The processing unit 4 which is aligned with the substrate surface 21 in a different radial plane of the roller table system 31 emits a scanned processing beam 45 for introducing two-dimensional structures on the processing path 41 of the substrate surface 21. However, it can also be arranged (not shown) in a common plane (e.g., axial plane of the roller table system 31) diametrically opposite the registration unit 1 at the roller table system 31.

A fast point-by-point focus tracking 43 is required, according to the invention, for the processing beam 45 along the linear processing path 41 for the height variations Δz occurring with the unevenness of the substrate 1 or substrate surface 21 as was described referring to FIGS. 4 and 6, so that this linear processing path 41 degenerates into a processing line of varying heights.

Conventional autofocus systems are not suited to these fast focus changes in z direction of the processing beam 45 which is scanned in x direction and which, for photolithographic direct exposure processes, is a laser beam. The basis for the fast implementation according to the invention of a local focus change via the processing path 41 is to detect height variations Δz of the substrate 2 simultaneous with the registration of the target marks 22 by means of the redundant twofold image capture by entocentric cameras 11 with gapless overlapping regions 13 of their angles of view 112 along a line-shaped scanning area (scanning line 23). As a result of this height measurement which is carried out for each image point of the scanning line 23 by triangulation calculations and which temporally and spatially precedes the processing unit 4, a point-by-point change of the processing focus FP along the processing path 41 of the processing beam 45 can be calculated by means of the computer unit 5 depending on the height variations Δz which are detected along the scanning line 23 of the registration unit 1 and calculated in the computer unit 5. This is in addition to the usual adapting of the data of two-dimensional structure patterns analyzed in the processing path 41 to the position of the substrate 2 that is acquired by means of the detected target marks 22.

Additional means for supplementing the usual focusing optics 44 are required for the fast focus changes along the processing path 41. These means must be of such a quality that they at least double the scanning frequency of the processing beam 45 in transverse direction x to movement direction y of substrate 2. The frequency of the focus change is preferably between two and three times, particularly preferably between five and twenty times, the scanning frequency of the processing beam 45 which ranges between 0.5 and 1 kHz when using a polygon scanner.

FIG. 8 shows a first possibility for realizing the focus tracking 43 by means of a movable lens 431.

A further constructional variant of the focus tracking 43 according to FIG. 9 provides a stationary angle mirror 432 and a movable retroreflector 433. The angle mirror 432 arranged in the already-focused bundle couples out the focused bundle to the retroreflector 433 and then couples it in again after reflection, and the retroreflector 433 moves toward the angle mirror 432 or away from the angle mirror 432 in order to displace the focus FP in z direction.

A further mirror-based implementation of the focus tracking 43 is described referring to FIGS. 10 to 12. FIGS. 10 and 11 show a mirror assembly with a mirror with variable curvature, designated in the following as an elastically bendable mirror 434. FIG. 11 shows the operating principle as mechanical equivalent in which the bendable mirror 434 is attached to a mirror holder 436 of a base body in a moveably articulated manner in the edge region and contacts a linear actuator in the central region in the form of a piezoelectric stack 435 which is supported at the same base body as the mirror holder 436.

FIG. 10 shows the physical implementation of the mirror assembly as a virtually monolithic component part in which the mirror holder 436, as a right parallelepiped, carries the elastically bendable mirror 434 as monolithically tapered, convex metal plate which is elastically mounted on two parallel, linear flexure bearings. Accordingly, the bendable mirror 434 is a convex or concave cylindrical mirror which can have its curvature in only one spatial direction.

According to the arrangement in FIG. 12, two elastically bendable mirrors 434 which are oriented crosswise, e.g., in x direction and y direction, are arranged in a folded beam path of multi-membered focusing optics 44 for the processing beam 45 (only shown in FIG. 7 and FIG. 8). In this case, the fast focus tracking 43 is integrated in the usual focusing optics 44. The intermediate focal plane 441 predetermines the point-by-point production of the two-dimensional structure (not shown) which is provided for processing and which is locally adapted to the position of the target marks 22 and transmitted in the image plane 442 to the advantageously utilized polygon scanner (not shown) for guiding the processing beam 45 along the height-controlled processing line 41 on the substrate 2. An advantage of this embodiment of the fast focus control with two one-dimensionally operating focus trackings 43 consists in that different focusing can be used in x direction (scanning direction of the processing beam 45) and y direction (movement direction of the substrate). Accordingly, different focus changes can be operated (if necessary) with astigmatic or other aspherical optics in the scanning direction and cross-scanning direction of the processing beam 45.

By using entocentric cameras 11 for target mark registration, the invention makes it possible to realize a gapless, approximately one-dimensional scanning line 23 on substrates 2 with height changes or curvatures which not only permits detection of the target marks 22 but also a measurement of the height and height variation Δz of the substrate 2. Based on a double-scan with two differently positioned cameras 11 along the scanning line 23 of the registration unit 1, triangulation measurements and triangulation calculations can be carried out in the overlapping regions 13 by entocentric line cameras whose angles of view 112 overlap. By means of point-by-point measurements, height variations Δz of the substrate surface 21 can be taken into account by means of a fast focus control in the processing unit 4, which is likewise operated with line-shaped processing path 41, and corrected during the control of the processing beam 45 by means of a focus tracking 43 or point-by-point along the processing path 41 to form a height-adjusted processing line.

In addition, the dynamic focus adjustment along the processing path 41 also makes it possible at the same time to correct known imaging-dependent focus deviations (resulting from the optical design or optical fabrication) of the processing beam 45 scanned along the processing path 41.

REFERENCE CHARACTERS 1 registration unit
11 camera
111 optical axis
112 angle of view
113 sensor chip
114 sensor line
12 housing (of the registration unit)
13 overlapping region (of the angles of view)
14 slight overlap (of angles of view)
15 objective (of the camera 11)
151 objective adapter
16 image plane (of the registration unit 1)
161 camera adapter
162 surface normal (of the sensor chip 113)
17 light sources (for illuminating the linear scanning area)
2 substrate
21, 21' substrate surface 22 target mark
23, 23' scanning line
3 table system
31 roller cable system (for continuous substrate)
32 calibration mark
4 processing unit
41 processing path
43 focus tracking
431 movable lens
432 (stationary) angle mirror
433 (movable) retroreflector
434 (elastically) bendable mirror
435 piezoelectric stack (linear actuator)
436 mirror holder
437 flexure bearing
44 focusing optics
441 intermediate image
442 image plane
5 computer unit
$F_n$, $F_{n+1}$ focal plane
FP (tracked) focus
x transverse direction (along the width of the substrate 2)
y movement direction (along the length of the substrate 2)
z focusing direction (along the height of the substrate 2)
$\Delta z$ height variation (of the substrate surface 21)

The invention claimed is:

1. A device for exposure control in photolithographic direct exposure of two-dimensional structures in photosensitive coatings on a substrate, comprising:
a registration unit for the registration of target marks located on a substrate surface,
a movable table system for the support of and defined one-dimensional movement of the substrate under the registration unit,
a processing unit with a controllable linear processing path for the photolithographic processing of the substrate by means of a processing beam for introducing the two-dimensional structures and a computer unit for controlling the alignment between the processing path and the substrate by means of local adjustment of the photolithographic processing depending on the position of the substrate determined by registered target marks, characterized in that a plurality of entocentric cameras are arranged in the registration unit in linear alignment transverse to the one-dimensional movement of the substrate to form a gapless linear scanning area over a predetermined width of the substrate and have angles of view extending in a direction of the linear scanning area, wherein the angles of view of adjacent of the entocentric cameras have an overlapping region along the linear scanning area in order to detect redundant image captures of the substrate of the adjacent entocentric cameras in the overlapping region, and in that the computer unit has means for calculating the position of the target marks from the redundant image captures in the overlapping region of the adjacent entocentric cameras additionally using a height position of the target marks which is determined by triangulation of a distance of the substrate surface.

2. The device according to claim 1, characterized in that the registration unit is outfitted with a plurality of the entocentric cameras for generating a linearly continuous, gapless sensor area that angles of view of the adjacent entocentric cameras have the overlapping region which is at least as large as one half of the angle of view, wherein the computer unit is adapted to determine the target marks positioned anywhere over the width of the substrate independent from the position of the target mark inside of gaplessly consecutive overlapping regions of the angles of view of the adjacent entocentric cameras by triangulation of a distance at any positions of the substrate surface.

3. The device according to claim 1, characterized in that the entocentric cameras are line cameras in order to form the line-shaped scanning area narrow, gapless and with the overlapping regions over the entire width of the substrate through the entocentric cameras with a large scanning length.

4. The device according to claim 1, characterized in that the entocentric cameras are directed to the substrate surface with optical axes parallel to one another, wherein the overlapping regions of the angles of view of all of the entocentric cameras are of equal size.

5. The device according to claim 1, characterized in that two adjacent of the entocentric cameras are directed to the substrate surface with optical axes at an inclination to one another, wherein the overlapping region of the angles of view of the entocentric cameras which are inclined relative to one another are adjusted in such a way that the angles of view of the two entocentric cameras completely overlap on the substrate surface.

6. The device according to claim 5, characterized in that the overlapping region which is formed by the entocentric cameras which are inclined relative to one another by pairs gaplessly adjoins at least one further overlapping region until the overlapping regions have an extension which corresponds at least to the width of the substrate, wherein an overlap can be provided between pairs of the entocentric cameras which are inclined relative to one another in order to ensure a gapless scanning area of the registration unit for all permissible height variations ($\Delta z$) of the substrate surface.

7. The device according to claim 5, characterized in that the entocentric cameras which are inclined relative to one another in pairs are arranged in such a way that they are subject to a Scheimpflug condition.

8. The device according to claim 1, characterized in that the computer unit additionally has a control for a fast focus tracking of the processing unit along the processing path depending on height variations ($\Delta z$) of the substrate surface, which comprises a triangulation of the target marks or any imaged structures of the substrate surface on the basis of the redundant image captures in the overlapping region of the adjacent entocentric cameras.

9. The device according to claim 1, characterized in that the registration unit has for the detection of the target marks only two of the entocentric cameras which are arranged on a scanning line transverse to the movement direction of the substrate with an overlapping region of from one one hundredth to one third of the angle of view of the entocentric camera when the substrate, as flexible continuous substrate, is guided tautly and without height variations ($\Delta z$) on a rolling table system, wherein the overlapping region of the angles of view of the two entocentric cameras are configured such that the triangulation is applicable for purposes of the accurate determination of the thickness of the substrate in the overlapping region of the angles of view on the rolling table system and can be assumed to be constant for an entire width of the rolling table system.

10. The device according to claim 1, characterized in that the registration unit is outfitted with light sources for illuminating the linear gapless scanning area which are arranged so as to be uniformly distributed in the housing to realize a scanning line which is homogeneously illuminated by darkfield or brightfield illumination.

11. The device according to claim 10, characterized in that the light sources are configured for a continuous illumination and have an arrangement for controlling at least one of brightness, incident angle or spectral region.

12. The device according to claim 10, characterized in that the light sources are adapted for a continuous illumination to enable image captures by controlling integration time of sensor lines by means of an electronic shutter principle.

13. The device according to claim 1, characterized in that a focus tracking for height variations ($\Delta z$) of the substrate is integrated in the processing unit and the focus tracking for the height variations ($\Delta z$) is determined by the computer unit by means of triangulation from images redundantly captured by two adjacent entocentric cameras of the registration unit that are adjustable in real time by fast focus correction for each image point of the registration unit, wherein the focus tracking is controllable based on changes in a lens position, mirror position or mirror curvature.

14. The device according to claim 13, characterized in that the focus tracking is controllable based on the change in the mirror curvature at least in a transverse direction x relative to a movement direction y of the substrate.

15. The device according to claim 14, characterized in that the focus tracking is separately controllable based on changes in the mirror curvature in the movement direction y of the substrate and the mirror curvature in the transverse direction x.

16. The device according to claim 13, characterized in that the focus tracking is controllable through change in the mirror curvature by means of a piezoelectric element.

17. The device according to claim 13, characterized in that the focus tracking is applicable based on changes in the lens position, the mirror position or the mirror curvature also for correcting image-dependent focus deviations of upstream focusing optics or other upstream optical elements resulting from the optical design or optical fabrication.

18. A method for exposure control in photolithographic direct exposure of two-dimensional structures in photosensitive coatings on a substrate having the following steps:
- arranging a plurality of entocentric cameras to form a gapless linear scanning area transverse to a movement direction of the substrate in a registration unit for detecting target marks located on the substrate, wherein the entocentric cameras have angles of view extending along the linear scanning area with an overlapping region formed by adjacent entocentric cameras in order to obtain redundant image captures of the substrate in the overlapping region from the adjacent entocentric cameras,
- moving the substrate on a movable table system in a defined one-dimensional movement below the registration unit,
- providing a processing unit for the photolithographic production of two-dimensional structures with a processing beam which is controllable along a linear processing path,
- detecting a spatial position with respect to length position, width position and a height position of target marks arbitrarily distributed over a given width of the substrate during one pass of the substrate through the linear scanning area of the registration unit,
- determining the positions of the target marks arbitrarily distributed over the width of the substrate from the redundant image captures in the overlapping region of the adjacent entocentric cameras additionally using a height position of the target marks which is determined from the redundant image captures of the adjacent entocentric cameras by means triangulation of a distance of the substrate surface,
- calculating data for alignment and local adjustment of the processing of the substrate with two-dimensional structures for the processing unit for controlling the processing beam along the linear processing path which is oriented transverse to the movement direction of the substrate, and
- controlling the alignment between the linear processing path and the substrate and local adjustment of the photolithographic processing depending on a position of the substrate determined by means of registered target marks.

19. The method according to claim 18, wherein the calculation of the spatial position of target marks arbitrarily distributed over the width of the substrate is extended based on a height position to the triangulation of further detectable structures of the substrate in the redundant images captured in the overlapping region during a passage of the substrate, and a fast focus adjustment of a focus (FP) of the processing beam is carried out by means of a focus tracking along a processing path based on a control of a lens position, mirror position or a mirror curvature.

20. The method according to claim 19, wherein the fast focus adjustment of the focus (FP) of the processing beam is carried out at a frequency which is at least two to three times higher than the conventional scanning frequency for the processing beam.

* * * * *